United States Patent
Ketelaars et al.

(10) Patent No.: US 8,951,427 B2
(45) Date of Patent: Feb. 10, 2015

(54) HOT MELT COMPOSITION AND A METHOD AND SYSTEM FOR MANUFACTURING ELECTRONIC AND/OR OPTICAL COMPONENTS USING SUCH A HOT MELT COMPOSITION

(71) Applicant: Oce Technologies B.V., Venlo (NL)

(72) Inventors: Björn H. A. J. M. Ketelaars, Tilburg (NL); Hylke Veenstra, Reuver (NL)

(73) Assignee: Oce Technologies B.V., Venlo (NL)

( * ) Notice: Subject to any disclaimer, the term of this patent is extended or adjusted under 35 U.S.C. 154(b) by 0 days.

(21) Appl. No.: 13/871,062

(22) Filed: Apr. 26, 2013

(65) Prior Publication Data

US 2013/0299449 A1 Nov. 14, 2013

(30) Foreign Application Priority Data

May 10, 2012 (EP) .................................. 12167480

(51) Int. Cl.
*B44C 1/22* (2006.01)
*C09D 5/00* (2006.01)
*C09D 11/34* (2014.01)
*H05K 3/00* (2006.01)
*H01L 31/0224* (2006.01)
*H01L 31/18* (2006.01)
*H05K 3/06* (2006.01)

(52) U.S. Cl.
CPC ............... *C09D 5/008* (2013.01); *C09D 11/34* (2013.01); *H05K 3/0076* (2013.01); *H01L 31/022425* (2013.01); *H01L 31/18* (2013.01); *H05K 3/0079* (2013.01); *H05K 3/061* (2013.01); *H05K 2203/122* (2013.01)
USPC .................. 216/50; 216/41; 216/42; 216/49; 216/83; 216/96

(58) Field of Classification Search
CPC combination set(s) only.
See application file for complete search history.

(56) References Cited

U.S. PATENT DOCUMENTS

| | | | |
|---|---|---|---|
| 4,767,489 A | 8/1988 | Lindner | |
| 6,153,667 A * | 11/2000 | Howald | 523/160 |
| 2009/0119914 A1 * | 5/2009 | Clark et al. | 29/846 |
| 2009/0308435 A1 * | 12/2009 | Caiger | 136/252 |
| 2011/0020970 A1 | 1/2011 | Caiger | |
| 2011/0039193 A1 | 2/2011 | Chang et al. | |
| 2011/0177651 A1 | 7/2011 | Mingirulli et al. | |
| 2012/0070992 A1 * | 3/2012 | Dong et al. | 438/694 |

FOREIGN PATENT DOCUMENTS

EP 2182786 A1 5/2010
WO WO 2008/021782 A2 2/2008

* cited by examiner

*Primary Examiner* — Lan Vinh
*Assistant Examiner* — Jiong-Ping Lu
(74) *Attorney, Agent, or Firm* — Birch, Stewart, Kolasch & Birch, LLP

(57) ABSTRACT

A method for manufacturing electrical and/or optical components, wherein a hot melt composition including an alkane based wax and an amorphous material as a masking material is used. The hot melt composition has a melting point of between 40° C. and 85° C. and a viscosity of between 5 and 20 mPa·s at not less than one temperature within the range of between 50° C. and 140° C. A hot melt composition includes between 40 weight % and 89.9 weight % of an alkane based wax; between 10 weight % and 50 weight % of an amorphous material; and between 0.1 weight % and 10 weight % of a phosphonium based ionic liquid. A system and a method for manufacturing electronic and/or optical components is provided, wherein after the etch processes and/or plating processes, the hot melt composition is removed from the substrate with the aid of hot water.

17 Claims, 2 Drawing Sheets

HOT MELT COMPOSITION AND A METHOD AND SYSTEM FOR MANUFACTURING ELECTRONIC AND/OR OPTICAL COMPONENTS USING SUCH A HOT MELT COMPOSITION

FIELD OF THE INVENTION

The present invention relates to a hot melt composition suitable for inkjet masking of a substrate in the production of electronic and/or optical components. The present invention also relates to the use of a hot melt composition for inkjet masking of a substrate in a process for patterning electronic and/or optical functional layers by etching and/or deposition processes. The present invention further relates to a method and system for manufacturing electronic and/or optical components wherein a mask of a hot melt composition is applied by inkjet printing prior to etching and/or deposition process steps and removed after said processing steps.

BACKGROUND ART

The use of inkjet masking for the manufacturing of electronic and/or optical components is known from the prior art.

For example in U.S. Pat. No. 4,767,489 a computer aided printer-etcher is disclosed as a printed circuit prototyper (PCP). The PCP may comprise an "ink-melt" type printer in which the ink-melt printer melts a wax or thermoplastic material and delivers it to the print substrate (copper coated polyester film) in microscopic dots which cool on the substrate and function to lock out the subsequently applied etch liquid. The techniques in further treating the printed circuit film after passage through the printer-etcher unit of the invention disclosed in U.S. Pat. No. 4,767,489 are conventional. Waxes or thermoplastic materials are conventionally removed by organic solvents.

Both US2009/0308435 and US2011/020970 disclose a process for manufacturing a solar cell. The process comprises the steps of: i) ink jet printing an alkali removable water insoluble hot melt inkjet ink onto a substrate comprising a silicon wafer to form a resist image on the substrate; ii) etching or plating the substrate in an aqueous acid medium; and iii) removing the resist with an aqueous alkali. It is also disclosed that conventional hot melt inks based on hydrocarbon waxes are used as a resist material, which is applied to the substrate by inkjet printing. Such conventional hot melt inks can be removed only by washing with organic solvents or by mechanical scraping. Both mentioned patent applications disclose that alkali soluble waxes may be used in a hot melt composition which can be easily removed by washing with aqueous alkali, whilst being insoluble in acidic media for etching and plating of solar cells US2011/0039193 discloses a printed mask derived from a composition of at least one compound including at least one alkaline-hydrolysable group, and at least one compound including at least one ethylene oxide group. The printed mask is removable using an alkaline solution in about 30 seconds or less.

U.S. Pat. No. 6,153,667 discloses a hot melt ink, which can be printed at a temperature of approximately 80° C. to 100° C. which ink includes an adhesion-facilitating substance most preferably being a phthalate ester of hydroabietyl alcohol; a viscosity-facilitating substance, preferably a hydrophobic oil, wax or wax-like substance; and a copolymer of polyvinyl pyrrolidone with one or several long-chain alpha-olefins with at least 10 carbon atoms.

It is a disadvantage of inkjet masking processes known in the art that alkaline removable hot melt compositions are used as a masking material (e.g. an etch resistant). Such hot melt compositions are not resistant to alkaline fluids. Moreover commercially available alkaline stripping solutions may be aggressive towards some types of substrates, such as silicon substrates. The processing possibilities of such substrates patterned with an alkali removable masking material are therefore limited.

It is another disadvantage of masking materials known in the art that removal of the masking material in general requires using organic solvents, which is not an environmental friendly way. Use of organic solvents in industry is not accepted for Health, Safety and Environment (HS&E) reasons.

It is therefore an object of the present invention to provide a hot melt composition for use as a masking material in the manufacturing of electronic and/or optical components, which hot melt composition provides sufficient chemical resistance to enable a wide range of etching processing steps and/or deposition processing steps.

Other objects of the present invention are to provide a method and a system for the manufacturing of electronic and/or optical components, wherein a hot melt composition can be accurately applied and easily removed in a safe and environmental friendly way

SUMMARY OF THE INVENTION

The objects are at least partly achieved by using a hot melt composition comprising an alkane based wax and an amorphous material as a masking material in a process for manufacturing electronic and/or optical components, the hot melt composition having a melting point of between 40° C. and 85° C. and a viscosity of between 5 and 20 mPa·s at not less than one temperature within the range of between 50° C. and 140° C.

Such a hot melt composition can be accurately applied by a printing technique, is resistant to both acidic and alkaline fluids used in etching and/or plating processing steps and is easily removable with the aid of water.

An additional advantage of using a hot melt composition according to the present invention is that the hot melt composition solidifies relatively fast (e.g. within 1-10 milliseconds) when printed on a relatively cold substrate (preferably 20° C.-40° C.). Because of this droplet spreading on the substrate is small and insensitive to the substrate surface properties like roughness and surface energy. More accurate masks (e.g. smaller line widths) may be provided on the surface of the substrate. Also the height of the mask may be increased when dot spreading is reduced provided that the droplet size of the printed hot melt composition remains the same. More accurate masks provide more accurate structuring of a functional layer in the further processing steps (e.g. etching and/or plating). A larger mask height enables structuring of functional layers with a high aspect ratio by deposition. This has a clear advantage for example for the plating of outer layers of printed circuit boards (PCB) where the high aspect ratio enables fine structure with low resistive loss. Another example is the plating of solar cell front side electrodes, where the high aspect ratio combines a low resistive loss with a low shading loss.

In another aspect, the present invention pertains to a hot melt composition comprising:
  between 40 weight % and 89.9 weight % of an alkane based wax;

between 10 weight % and 50 weight % of an amorphous material;

between 0.1 weight % and 10 weight % of a phosphonium based ionic liquid.

The alkane based wax preferably is a paraffin wax and the amorphous material preferably is a phthalate ester of hydroabietyl alcohol.

The hot melt composition according to the present invention may comprise a mixture of alkane based waxes, as long as the total amount ranges between 40 weight % and 89.9 weight %.

The hot melt composition according to the present invention may comprise a mixture of amorphous materials, as long as the total amount ranges between 10 weight % and 50 weight %.

The hot melt composition according to the present invention may comprise a mixture of phosphonium based ionic liquids, as long as the total amount ranges between 0.1 weight % and 10 weight %.

In another aspect, the present invention pertains to a method for manufacturing electronic and/or optical components, the method comprising the steps of:

providing a hot melt composition comprising an alkane based wax and an amorphous material, the hot melt composition having a melting point of between 40° C. and 85° C. and a viscosity of between 5 and 20 mPa·s at not less than one temperature within the range of between 50° C. and 140° C.;

providing a substrate;

applying the hot melt composition in a predetermined pattern on a surface of the substrate with inkjet printing;

performing etching and/or deposition processing steps at a maximum temperature of at least 10° C. below the melting temperature of the hot melt composition;

removing the hot melt composition from the substrate with the aid of a water-based stripping fluid having a temperature of at least 10° C. above the melting temperature of the hot melt composition and below the boiling point of the water-based stripping fluid.

The water-based stripping fluid comprises water and may comprise additives, for example surfactants. Such additives may increase the boiling point of the water. Therefore, the water-based stripping fluid has a boiling point (at a standard pressure of 1 atm. (≈101.3 kPa)) of 100° C. or higher, in particular between 100° C. and 110° C. depending on the concentration of additives in the water-based stripping fluid.

The etching and/or deposition processing (plating) steps may be performed by subjecting the substrate comprising a predetermined pattern of the hotmelt composition to an alkaline and/or acidic fluid.

For example, when a hot melt composition is provided having a melting point of 75° C., the jetting temperature may be 100° C. The etching and/or plating steps may be performed at a temperature of below 65° C. At the end of the processing steps, the hot melt composition mask may be removed with hot water having a temperature of between 85° and 100°, preferably between 90° and 95°. The method according to the present invention provides a temperature operating range for etching and/or plating processing steps which is distinct from the temperature operating range for removing the mask. This enables the use of aqueous acidic and alkaline etching and/or plating solutions which do not remove the mask and easy removal of the mask with water at elevated temperatures.

In yet another aspect, the present invention relates to a system for performing a method according to the present invention, i.e. a system for manufacturing electronic and/or optical components, the system comprising:

a printing means;

a hot melt composition comprising an alkane based wax and an amorphous material, the hot melt composition having a melting point of between 40° C. and 85° C. and a viscosity of between 5 and 20 mPa·s at not less than one temperature within the range of between 50° C. and 140° C.

In an embodiment, the system further comprises a removing means configured for removing the hotmelt composition from a substrate with the aid of a water-based stripping fluid having a temperature of at least 10° C. above the melting temperature of the hot melt composition and below the boiling point of the water-based stripping fluid.

BRIEF DESCRIPTION OF THE DRAWINGS

The present invention will become more fully understood from the detailed description given herein below and accompanying schematic drawings which are given by way of illustration only and are not limitative of the invention, and wherein.

DETAILED DESCRIPTION

Hot Melt Composition

Figure 1:
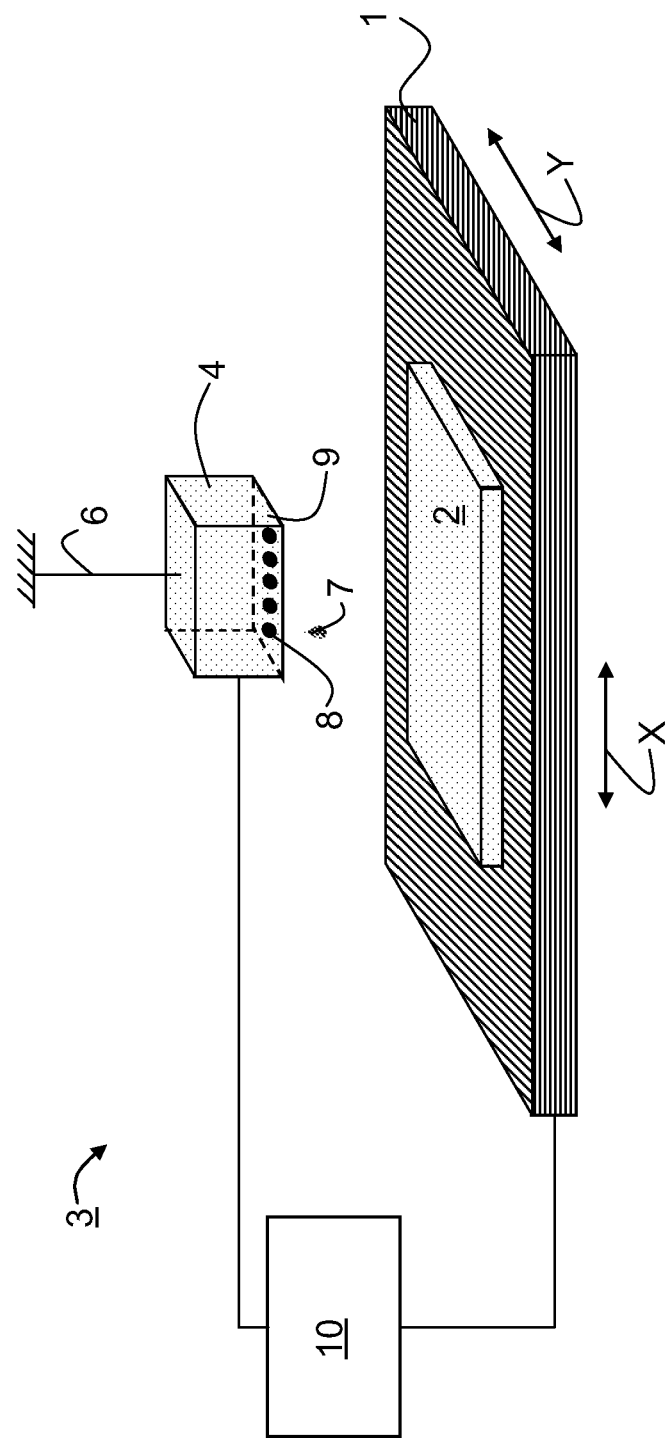
FIG. 1 shows a schematic representation of a printing device for ink jet printing a hot melt composition onto a substrate in the manufacturing of electronic and/or optical components.

In an embodiment, the hot melt composition as used in accordance with the present invention comprises the alkane based wax in an amount of between 40 weight % and 89.9 weight %, preferably between 50 weight % and 70 weight %, more preferably between 55 weight % and 65 weight % relative to the total hot melt composition. In general, the higher the amount of the alkane based wax is, the lower the viscosity of the hot melt composition. Therefore the lower the selected jetting temperature is, the higher the amount of alkane based wax in the hot melt composition will be.

An alkane based wax is a wax having the following general formula: $C_nH_{2n+2}$, wherein n is an integer ranging from 15 to 60, preferably from 18 to 50 and even more preferably from 20 to 40. The alkane based wax may comprise linear alkanes, branched alkanes and combinations of the plural.

In an embodiment, the alkane based wax comprises paraffin wax and/or isoparaffin wax, which are mixtures of homologues from the C20-C40 alkane series, i.e. a mixture of alkanes comprising between 20 and 40 carbon atoms. Paraffin wax generally comprises linear alkanes and isoparaffin wax generally comprises branched alkanes. In practice a mixture of paraffin waxes and isoparaffin waxes may be employed.

In an embodiment, the hot melt composition as used in accordance with the present invention comprises the amorphous material in an amount of between 10 weight % and 50 weight %, preferably between 20 weight % and 45 weight %, more preferably between 30 weight % and 40 weight % relative to the total hot melt composition. The amorphous material in the hot melt composition as used in the present invention functions as a viscosity modifier, i.e. the viscosity of the hot melt composition generally increases with an increasing amount of amorphous material. The viscosity of the hot melt composition can be optimized for droplet formation in a piezo inkjet print head. A very low viscosity can introduce instability of the meniscus position in the nozzles of the print head, especially during printing with a high drop-on-demand frequency. This can results in ink films on the nozzle plate or in increased drop positioning errors due to jet angles. A very high viscosity of the hot melt composition can result in a situation that the actuator power of the piezo print head is insufficient for the droplet formation and no droplets are ejected or droplets with a very low droplet speed with increased positioning errors.

In an embodiment, the hot melt composition as used in accordance with the present invention comprises, a paraffin wax as the alkane based wax.

In an embodiment, the hot melt composition as used in accordance with the present invention an ester of an aromatic dicarboxylic acid and a polycyclic mono alcohol, preferably a phthalate ester of hydroabietyl alcohol is used as an amorphous material.

In an embodiment, the hot melt composition as used in accordance with the present invention further comprises a colorant, preferably in an amount of between 0.1 weight % and 10 weight %, relative to the total hot melt composition. The colorant may be a pigment or dye, a mixture of pigments, a mixture of dyes or a mixture of at least one pigment and at least one dye. The function of the colorant is to improve the contrast between the substrate and the applied mask. This enables visual inspection of the substrate patterned with the hot melt composition. A mask containing errors may be removed from the substrate prior to subjecting it to irreversible etching and/or plating steps. Hence, the overall yield of the manufacturing process of electronic and/or optical components may be increased in this way. The presence of a colorant in the hot melt composition can also be used for calibration purposes, which may result in improved alignment of the printed pattern with the substrate.

In an embodiment, the hot melt composition as used in accordance with the present invention further comprises an ionic liquid in an effective amount of between 0.1 weight % and 10 weight %, relative to the total hot melt composition. The ionic liquid is added to the hot melt composition to provide conductivity to the hot melt composition for the purpose of proper functioning of level sensing in a inkjet printing device comprising a level sensor which operation is based on the conductivity of the content of an ink chamber. Preferably a phosphonium based ionic liquid is used in the hot melt composition. Such ionic liquids provide enhanced thermal stability under various conditions, in particular phosphonium based ionic liquids are more thermally stable than ammonium and imidazolium salts. Furthermore, phosphonium based ionic liquids do not contain acidic protons and are inert in most systems. Therefore such ionic liquids are extremely suitable for use in a hot melt composition as used in accordance with the present invention. Preferred is a derivative of tetraalkylphosphonium bis(tetraalkyl)phosphinate, e.g. trihexyl(tetradecyl)phosphonium bis(2,4,4-trimethylpentyl)phosphinate, available under the trade name CYPHOS® IL-104, or tributylmethylphosphonium dibutyl phosphate.

Method for Manufacturing Electronic and/or Optical Components

In an embodiment, the step of removing the hot melt composition from the substrate comprises immersing the substrate in a stripping bath comprising the water-based stripping fluid, preferably a hot water bath.

In an embodiment, the water-based stripping fluid used to remove the hot melt composition comprises a surfactant, preferably selected from the group consisting of: poly(oxyethylene)alkyl ether, such as poly(oxyethylene)(4) lauryl ether, available under the trade name BRIJ® 30; and an ethoxylated and/or propoxylated linear primary 12-14 carbon number alcohol, such as SURFONIC® LF-17. The surfactants may be used alone or in a combination of the plural. The surfactant assists in emulsifying the molten hot melt composition in the removing step.

In an embodiment, the step of removing the hot melt composition from the substrate is performed with ultrasonic support. Ultrasonic support assists delaminating of the hot melt composition form the substrate and further assists in emulsifying the molten hot melt composition in the removing step.

In an embodiment, the method according to the present invention is used to manufacture solar cells.

In an embodiment, the removed hot melt composition may be separated from the water phase by bringing the temperature of the contaminated water below the melting point of the hotmelt composition such that the hot melt composition solidifies and can be easily removed from the water, for example by filtration. The recovered hotmelt composition may even be reused in a masking process.

Applications

The method according to the present invention may be used in a number of applications, such as:
- the manufacturing of printed circuit boards (PCBs): etching of inner layers and plating of outer layers;
- the manufacturing of solar cells: honey comb texturization, selective emitter plating of front side electrodes and rear-side patterning for back-contact cells;
- the manufacturing of OLED lighting;
- the manufacturing of radio frequency identification (RFID) tags System In an embodiment, the system for performing a method according to the present invention as described above comprises an inkjet printing means, preferably an inkjet printing means suitable for hotmelt inkjet printing. In particular the system comprises an inkjet printing means based on a piezoelectric actuation mechanism. In particular the system comprises an inkjet printing means comprising an ink level sensing mechanism based on electrical conductivity of a marking material, in particular a hot melt composition.

In an embodiment, the system for performing a method according to the present invention as described above comprises a removing means configured for removing the hotmelt composition from a substrate with the aid of a water-based stripping fluid having a temperature of at least 10° C. above the melting temperature of the hot melt composition and below the boiling point of the water-based stripping fluid, wherein the removing means comprises a stripping bath containing the water-based stripping fluid which is kept at a temperature within the above described range, into which the printed substrates may be immersed.

The stripping bath may be in fluid connection with a regenerating module. The hot water-based stripping fluid, in particular hot water, contaminated with hot melt composition removed from the substrate may be fed to a regenerating module where the hot melt composition may be separated from the water phase by bringing the temperature of the contaminated water below the melting point of the hot melt composition (i.e. cooling) such that the hot melt composition solidifies. The solidified hotmelt composition may be removed from the water-based stripping fluid with the aid of a filtering means. The liberated heat from the hot water during cooling may be re-used for preheating fresh water and/or regenerated water, for example by a heat exchanger or a heat pump.

To compensate for losses of water-based stripping fluid in the regeneration process (or due to evaporation), fresh water-based stripping fluid may be supplied to the stripping bath.

Due to regeneration of water contaminated with hot melt composition, the concentration of additives in the stripping fluid may change which may be compensated for by either supplying fresh water or fresh additive (e.g. surfactant) to the stripping bath. It may therefore be advantageous that fresh water and optional additives, such as surfactants may be separately supplied to the stripping bath.

In an embodiment, the removing means comprises an additive supply means. The additive supply means may comprise an additive storage means (tank), a supply duct, a supply pump or other dosing means (e.g. in case solid additives are used).

The additive supply means may be temperature controlled.

An advantage of this embodiment is that a better control of the concentration of additives, in particular surfactants, in the water-based stripping fluid is enabled.

The system may further comprise a heating means arranged for heating the fresh water-based stripping fluid supply (or separate fresh water and additives supplies) and/or the regenerated water-based stripping fluid before the water-based stripping fluid is fed to the stripping bath. The heating means may for example comprise a conductive heating means. To compensate for a (small) loss of water in the regenerating module, fresh water may be fed to the stripping bath.

In an embodiment, the contents of the water bath is temperature controlled. For this purpose the stripping bath may comprise a temperature sensor, a heater and a temperature controller. In this embodiment, reheating of the regenerated water-based stripping fluid supply and/or the fresh water-water based stripping fluid supply may be dispensed with.

In an embodiment, the system comprises an ultrasonic support unit being operatively connected with the (hot) water bath. Ultrasonic support units are known in the art.

The removing means for removing a printed mask of a hotmelt composition from a substrate (which may or may not be further processed, e.g. by etching or plating steps) is however not limited to the above described embodiments.

In an embodiment, hot water optionally comprising a surfactant may be brought into contact with a substrate comprising a mask of a hot melt composition according to the present invention by flowing the hot water along the substrate, by moving the printed substrate underneath a water curtain, a water shower or a water spraying device.

FIG. 1 shows an ink jet printing assembly 3. The ink jet printing assembly 3 comprises supporting means 1 for supporting a substrate 2. The supporting means are shown in FIG. 1 as a flat surface, but may also be a rotatable drum, supporting a flexible substrate (e.g. a foil). The supporting means may be optionally provided with suction holes for holding the image receiving member in a fixed position with respect to the supporting means. The embodiment shown in FIG. 1 comprises a X-Y table as a substrate supporting means 1. The X-Y table moves in both the X and Y direction, as indicated with double arrows X and Y respectively, in accordance with a predetermined desired pattern. In this embodiment, the ink jet printing assembly 3 comprises a stationary print head 4, i.e. the print head 4 is rigidly fixed to its surroundings as indicated with 6. In an alternative embodiment, the ink jet printing assembly 3 comprises a stationary supporting means 1 and a print head 4 mounted on a carriage (not shown) scanning in both the X and Y direction. In yet another embodiment, a combination of an X-Y table and a scanning print head is foreseen. For example, a substrate supporting means stepwise moving in the X direction and a print head mounted on a carriage scanning in the Y direction. In yet another embodiment a fixed substrate wide array of print heads is used and the substrate moves in print direction without scanning. The print head 4 comprises an orifice surface 9, a projection of which is shown as an interrupted line in FIG. 1. The orifice surface 9 is provided with at least one orifice 8. The print head 4 is configured to eject droplets 7 of a masking material, preferably a hot melt masking material (etch resist) according to the present invention onto the substrate 2. The substrate supporting means 1 and/or the carriage comprising the print head (depending on the embodiment and the print head 4 are controlled by suitable controlling means 10. The substrate may be any substrate used in the manufacturing of electronic and/or optical components Substrates used in PCB manufacturing comprise conducting layers, typically made of thin copper foil. Insulating layers of a dielectric are typically laminated together with epoxy resin pre-preg. The board is typically coated with a solder mask that is green in color. There are quite a few different dielectrics that can be chosen to provide different insulating values depending on the requirements of the circuit. Some of these dielectrics are polytetrafluoroethylene (Teflon), FR-4, FR-1, CEM-1 or CEM-3. Well known pre-preg materials used in the PCB industry are FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Non-woven glass and epoxy), CEM-4 (Woven glass and epoxy), CEM-5 (Woven glass and polyester).

FR-4 is by far the most common material used today. The board with copper on it is called "copper-clad laminate".

Substrates used in solar cell fabrication may comprise monocrystalline silicon, polycrystalline silicon, amorphous silicon, cadmium telluride, and copper indium selenide/sulfide. A typical solar substrate is mono- or polycrystalline silicon in 6"×6" wafer form.

For OLED manufacturing suitable materials that may be used for the substrate include glass, quartz, sapphire, plastics, or any other transparent material. The problem with most available substrates, especially plastics, is their high air and moisture permeability, which may damage the cathode structure and impair OLED function. In addition, the substrate must also meet specific requirements in terms of chemical resistance, temperature stability and moisture sensitivity. On the substrate is typically a transparent conductor deposited, e.g. indium tin oxide (ITO), or other materials. To reduce the electrical resistance of the transparent conductor layer, often a metal layer is deposited on top, which is patterned in a busbar grid.

Only one print head 4 is depicted for demonstrating the invention. In practice an arbitrary number of print heads may be employed, in particular to provide redundancy for compensating failing nozzles.

The print head 4 comprises an orifice surface 9 having at least one orifice 8, in fluid communication with a pressure chamber containing fluid marking material provided in the print head 4. On the orifice surface 9, a number of orifices 8 is arranged in a linear array. Five orifices 8 are depicted in FIG. 1, however obviously in a practical embodiment several hundreds or thousands of orifices 8 may be provided in a print head 4, optionally arranged in multiple arrays. The image dots are formed by ejecting droplets of marking material from the orifices 8.

Upon ejection of the masking material, some masking material may be spilled and stay on the orifice surface 9 of the print head 4. The masking material present on the orifice surface 9, may negatively influence the ejection of droplets and the placement of these droplets on the substrate 2. Therefore, it may be advantageous to remove excess of ink from the orifice surface 9. The excess of ink may be removed for example by wiping with a wiper and/or by application of a suitable anti-wetting property of the surface, e.g. provided by a coating.

In solar cell applications a complete line of missing droplets will severely hamper the device performance or cause yield loss, e.g. in honeycomb texturization a line of unprinted droplets will cause very deep etching of that line which reduces the mechanical wafer strength; in applications with front-side plating a line of unprinted droplets can result in ghost-plating diminishing the commercial attractiveness of the cell due to low aesthetic quality, or can even result in shorting the solar cell.

The main factor in the reliability of an inkjet printing system is the combination of print head and the ink which should be carefully optimized for each other, but nozzle failure is inevitable in low-cost mass production inkjet printing. During extreme testing conditions a failing nozzle can occur once every $10^9$ droplets, this corresponds to once every 30 wafers ($30*10^6$ droplets per wafer) which is unacceptable, but shows the worst-case scenario. To obtain acceptable yields, the reliability of a given print head and ink combination needs to be improved by other ways; one of them is using a low printing frequency, since nozzle failure occurs more often while printing with high frequency. The printing frequency is determined by the resolution of the image (expressed in dots per inch) and by the relative speed of the substrate compared to the print head. Solar cell applications by inkjet printing require feature sizes smaller than 50 μm which typically results in image resolutions of at least 600 dpi. The movement speed of the substrate strongly affects the throughput, which for typical industrial solar cell production is around 2400 cells/hour; when the jetting frequency is lowered to increase the reliability this will severely affect the throughput.

One can also diminish the effects of nozzle failure by making sure a failing nozzle does not result in a complete line being misprinted. This is obtained by printing one line with different nozzles (so-called quality factor). E.g. a quality factor of 4 states that one line in the print direction is printed by 4 different nozzles; this quality factor reduces the effects of a failing nozzle, but also multiplies the amount of printing swaths needed to complete the print pattern by 4, which severely reduces the throughput.

The third way of improving the reliability is by detecting failing nozzles and using redundant printing strategies to correct for these failing nozzles. This detection of failing nozzles can be performed indirectly by inspecting the print pattern after printing and forming a feed-back loop to determine the failing nozzle number, but this indirect detection requires expensive high resolution, high speed imaging systems. Before this indirect detection system has identified a failing nozzle many wafers have been printed which will all be rejected because of this defect. In the CrystalPoint print head from Océ Technologies direct detection is performed by using the piezo-electric actuation device for both generating a pressure wave for ejecting droplets and as a sensor sensing residual pressure waves inside the pressure chamber. The sensed electric response gives an indication when a nozzle is failing. Failing nozzles are detected (potentially) real-time and directly on the print head forming a very short feedback loop and significantly reducing the effects of a failing nozzle. With the above described detection technology the occurrence of an undetected failing nozzle in the aforementioned extreme testing conditions is reduced to once every $10^{12}$ droplets corresponding to once every 30000 wafers; reducing the amount of misprints by a factor 1000.

Figure 2:
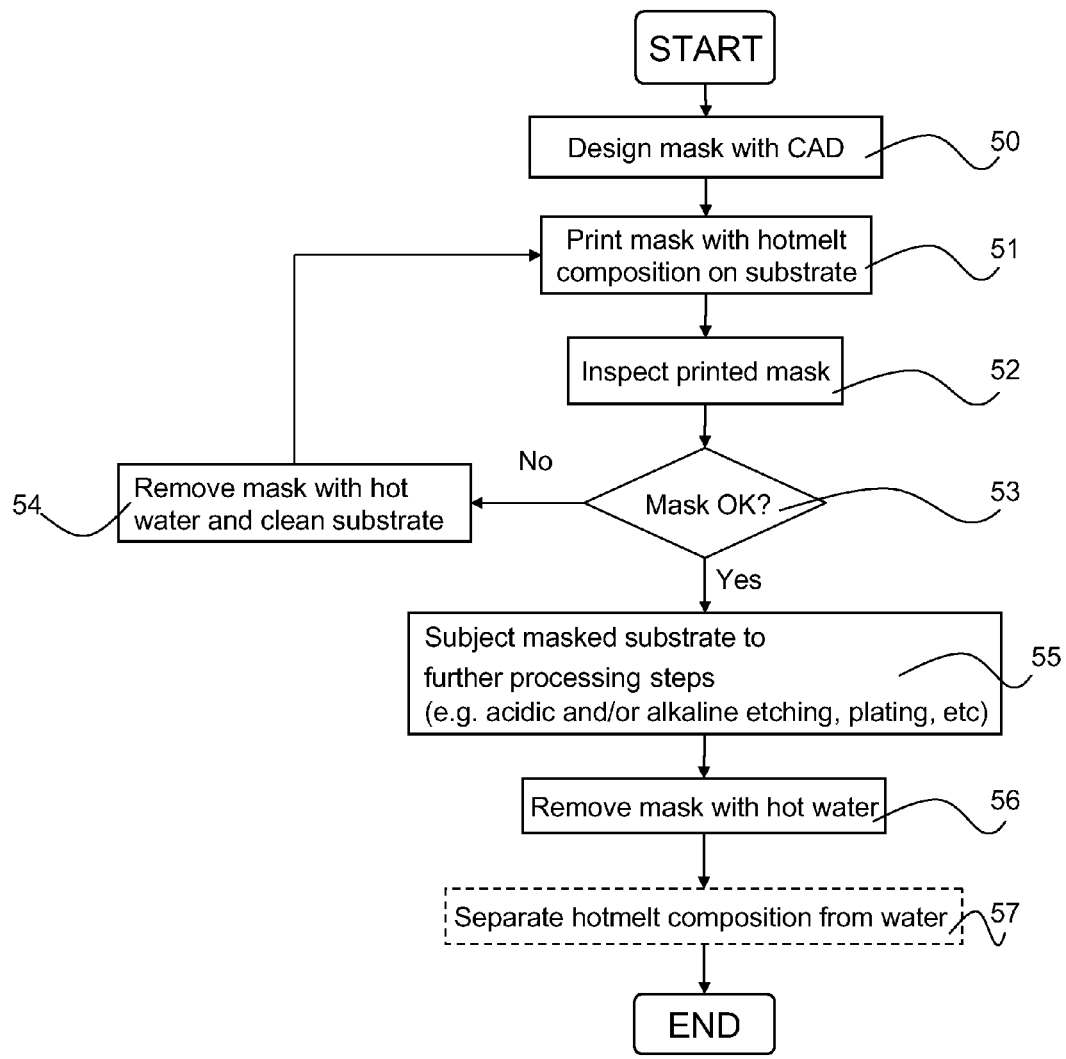
FIG. 2 shows a schematic block diagram regarding the method in accordance with the present invention for manufacturing an electronic and/or optical component.

FIG. 2 shows a schematic block diagram regarding the method in accordance with the present invention for manufacturing an electronic and/or optical component. In a first step 50 a desired mask pattern is designed with the aid of a CAD program. In a second step 51 the mask pattern is printed onto a surface of a substrate with a hot melt masking material by an inkjet printing process. In a third step 52 the printed substrate is inspected and checked on print errors. If errors present the mask are detected (step 53), the printed mask is removed from the substrate by hot water, and the substrate is thoroughly cleaned and then subjected to the inkjet printing step once more (step 54). If no errors present in the printed mask are detected the processing proceeds with a fourth step 55 wherein a number of operations may be performed, e.g. acidic or alkaline etching, plating, etc. In a fifth step 56 the mask is removed by subjecting the processed and patterned substrate comprising a mask of a hot melt composition to hot water, for example of a temperature of between 90° C. and 95° C. (at least 10° C. above the melting temperature of the hot melt composition). The hot water optionally comprises a surfactant, e.g. ethoxylated and/or propoxylated linear primary 12-14 carbon number alcohol, more specific SURFONIC LF-17. The removing step is optionally ultrasonic supported. In an optional sixth step 57 the hot melt is filtered out of the water after cooling down below the melting point of the hot melt composition.

EXAMPLES

Measurement Techniques

Viscosity

Viscosity was measured with a HAAKE Rheostress RS 600 rheometer equipped with a HAAKE Universal Temperature Controller using plate-plate geometry sensor system (PP60) in a shear range rate of between 10 s$^{-1}$ and 1000 s$^{-1}$ and a temperature range of between and including 50° C. and 140° C. (CR Method).

Melting Point

The melting point was measured with differential scanning calorimetry (DSC), by using a TA Instruments 2000 apparatus. The measuring program was as follows:

1) Equilibrate at −50° C.; 2) Ramp up to 150° C. at 20° C./min; 3) Isotherm for 2 min at 150° C.; 4) Ramp down to −50° C. at 20° C./min; 5) Isotherm for 5 min at −50° C.; 6) Ramp up to 150° C. at 20° C./min.

Nitrogen was used as a purge gas and perforated aluminum Tzero pans were used. The melting points were determined during the second heating run (step 6).

Example 1

Preparing a Hot Melt Composition for Use According to the Present Invention

Paraffin wax (CAS [8002-74-2], obtained from Sigma-Aldrich, The Netherlands), Cellolyn 21-E (CAS [36388-36-0]; a phthalate ester of hydroabietyl alcohol manufactured by and obtained from Hercules, Rijswijk, The Netherlands) and CYPHOS® IL-104 (CAS [465527-59-7] obtained from Sigma-Aldrich, The Netherlands) were melt mixed at a temperature of 130° C. and filtered over a glass filter having a pore size of 1 μm. The hot melt composition was then cooled down and pelletized.

The relative amounts of the starting materials were chosen such that the final product had the following composition:

58 weight % paraffin wax;
38 weight % Cellolyn 21-E; and
4 weight % CYPHOS® IL-104.

The viscosity of this composition was determined according to the above method and was 6.4 mPa·s at 130° C.

The melting point was determined according to the above method and was 55° C.

Example 2

Formation of Solar Cell Front Side Electrodes

The substrate was a 200 μm thick multicrystalline textured silicon wafer (area 243 cm$^2$, p-type (boron) bulk silicon, with an n-type diffused POCl$_3$ emitter SiN$_x$ ARC layer on the wafer's emitter applied by CVD).

The ink composition from example 1 was printed on the front face of the substrate in a negative H pattern consisting of two 1.5 mm wide openings in the pattern for the bus bars connected by 20 μm wide openings in the pattern for parallel finger lines having a distance of 1 mm between each other.

The printed substrate was immersed into an etching solution consisting of 2 volume % HF and 20 volume % HNO$_3$ in water to etch through the ARC layer. After etching nickel was deposited from an electro less plating bath. A nickel silicide was formed to reach optimal electrical resistivity. During the seed contact formation, different nickel plating baths (acidic and alkaline), based on sodium hypophosphite as a reducing agent, were used. Using an inline light induced plating (LIP) machine silver was applied on top of the nickel silicide, until a height of 20 μm was reached for the plated silver.

Final step in the processing sequence was the stripping of the ink whereby the substrate was processed using:
Rinsing with 90° C. DI water; followed by
Ultrasonic cleaning using a bench top cleaner and a 5 weight % solution of SURFONIC® LF-17; followed by
Rinsing with 90° C. DI water; followed by
Drying with nitrogen.

Example 3

Honeycomb Texturizing of Solar Cells

The substrate was a 200 μm thick multicrystalline non-textured silicon wafer (area 243 cm$^2$, p-type (boron) bulk silicon). This wafer was weakly polished in an acidic solution. The ink composition from example 1 was printed on the front face of the substrate in a hexagonal structure. The rear side was fully covered with ink.

The printed substrate was immersed into an etching solution consisting of 33 volume % HF, 65 volume % HNO$_3$ and 2 volume % acetic acid prepared from 50 weight % HF, 69 weight % HNO$_3$ and 100 weight % acetic acid at 12° C. To facilitate a more defined and developed honeycomb structure, the etch bath was agitated with a magnetic stirrer. After etching the mask was stripped using an identical procedure as described in example 2.

Example 4

ITO Etching OLED Lighting/MAM Etching OLED Lighting

An OLED substrate was provided consisting of several different layers: 0.7 mm glass with sputtered ITO layer and sputtered MAM layer (molybdenum-aluminum-molybdenum stack). The MAM layer is applied for contacting purposes and to reduce the electrical resistance of the transparent ITO layer by a busbar grid.

After cleaning the substrate a busbar pattern was printed on the MAM side of the substrate with the ink composition from example 1.

The MAM layer of the printed substrate was etched with an acidic mixture containing a major amount of phosphoric acid and a small amount of nitric acid.

The resist was then stripped according to the same procedure as in example 2, and an additional cleaning step was used.

Then a second pattern was printed with the ink composition of example 1, covering parts of the remaining MAM layer and parts of the ITO layer.

The uncovered parts of the ITO layer were etched with a mixture of hydrochloric acid and iron(III) chloride at elevated temperature. To evaluate the etching behavior of this etchant, test substrates were etched and the results analyzed by SEM. No ITO residues were found nor was excessive thinning or break-through of ITO-lines observed.

Example 5

Printed Circuit Board Inner Layer Etching

The used substrate was a FR4 copper clad with a copper layer having a thickness of 5 μm.

A test pattern was printed with the ink composition of example 1, comprising of parallel lines, the lines having a width of 50 μm and a pitch of 70 μm.

The printed substrate was etched in an alkaline etching bath containing a solution of ammonium hydroxide (NH$_4$OH) and ammonium chloride (NH$_4$Cl) in water. The copper concentration was 160 to 165 grams per liter. The chloride concentration was 240 to 270 gram per liter solution. The pH was 8.1 to 8.2 and the temperature was between 43 and 48 degrees Celsius. The etching time was 5 seconds. Then the etched substrate was rinsed in demi water at room temperature.

The masking ink was removed according to the same procedure as in example 2. The resulting substrate had 35±5 μm conductive tracks with a pitch of 70 μm.

The invention claimed is:

1. A method for manufacturing electronic and/or optical components, comprising
applying, on a surface of a substrate, a water removable hot melt composition comprising an alkane based wax and an amorphous material as a masking material, the hot melt composition having a melting point of between 40° C. and 85° C. and a viscosity of between 5 and 20 mPa·s at not less than one temperature within the range of between 50° C. and 140° C.; and
removing the hot melt composition from the substrate with the aid of a water-based stripping fluid having a temperature of at least 10° C. above the melting temperature of the hot melt composition and below the boiling point of the water-based stripping fluid, wherein said water-based stripping fluid consists essentially of water.

2. The method according to claim 1, wherein the alkane based wax is present in an amount of between 40 weight % and 89.9 weight % relative to the total hot melt composition.

3. The method according to claim 1, wherein the amorphous material is present in an amount of between 10 weight % and 50 weight % relative to the total hot melt composition.

4. The method according to claim 1, wherein the amorphous material comprises an ester of an aromatic dicarboxylic acid and a polycyclic mono alcohol.

5. The method according to claim 4, wherein the amorphous material comprises a phthalate ester of hydroabietyl alcohol.

6. The method according to claim 1, wherein the hot melt composition further comprises a colorant.

7. The method according to claim 6, wherein the colorant is present in an amount of between 0.1 weight % and 10 weight %, relative to the total hot melt composition.

8. The method according to claim 1, wherein the hot melt composition further comprises an ionic liquid.

9. The method according to claim 8, wherein the ionic liquid is a phosphonium based ionic liquid present in an amount between 0.1 weight % and 10 weight %, relative to the total hot melt composition.

10. The method according to claim 1, wherein said water is deionized water.

11. A method for manufacturing electronic and/or optical components, the method comprising the steps of:
   applying a hot melt composition in a predetermined pattern on a surface of a substrate with inkjet printing, said hot melt composition comprising an alkane based wax and an amorphous material, the hot melt composition having a melting point of between 40° C. and 85° C. and a viscosity of between 5 and 20 mPa·s at not less than one temperature within the range of between 50° C. and 140° C.;
   performing etching and/or deposition processing steps at a maximum temperature of at least 10° C. below the melting temperature of the hot melt composition;
   removing the hot melt composition from the substrate with the aid of a water-based stripping fluid having a temperature of at least 10° C. above the melting temperature of the hot melt composition and below the boiling point of the water-based stripping fluid, wherein said water-based stripping fluid consists essentially of water.

12. The method according to claim 11, wherein the step of removing the hot melt composition from the substrate comprises immersing the substrate in a stripping bath comprising the water-based stripping fluid.

13. The method according to claim 11, wherein the water-based stripping fluid comprises a surfactant.

14. The method according to claim 13, wherein the surfactant is selected from the group consisting of poly(oxyethylene)alkyl ether, and ethoxylated and/or propoxylated linear primary 12-14 carbon number alcohol.

15. The method according to claim 11, wherein the step of removing the hot melt composition from the substrate is performed with ultrasonic support.

16. The method according to claim 11, wherein the method comprises an additional step of separating the hot melt composition from the water by bringing the water below the melting point of the hot melt composition and filtering the water.

17. The method according to claim 11, wherein said water is deionized water.

* * * * *